United States Patent
Nishizawa

(10) Patent No.: US 7,521,918 B2
(45) Date of Patent: Apr. 21, 2009

(54) MICROCOMPUTER CHIP WITH FUNCTION CAPABLE OF SUPPORTING EMULATION

(75) Inventor: Kazuyuki Nishizawa, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 46 days.

(21) Appl. No.: 11/266,374

(22) Filed: Nov. 4, 2005

(65) Prior Publication Data
US 2006/0097285 A1 May 11, 2006

(30) Foreign Application Priority Data
Nov. 5, 2004 (JP) ............................. 2004-322877

(51) Int. Cl.
*G01R 31/26* (2006.01)
*G06F 9/455* (2006.01)
(52) U.S. Cl. .................... 324/158.1; 324/765; 324/763; 703/27; 703/28
(58) Field of Classification Search ......... 324/754–765, 324/158.1; 703/23–28
See application file for complete search history.

(56) References Cited

U.S. PATENT DOCUMENTS

| 4,527,234 A | * | 7/1985 | Bellay | 703/28 |
| 5,805,865 A | * | 9/1998 | Mimura et al. | 703/28 |
| 5,898,862 A | * | 4/1999 | Vajapey | 703/28 |

FOREIGN PATENT DOCUMENTS

| JP | 03-083143 | 4/1991 |
| JP | 2000-267876 | 9/2000 |
| JP | 2002-007164 | 1/2002 |
| JP | 2002-299567 | 10/2002 |

* cited by examiner

*Primary Examiner*—Ha Tran T Nguyen
*Assistant Examiner*—Emily Y Chan
(74) *Attorney, Agent, or Firm*—Young & Thompson

(57) ABSTRACT

A microcomputer chip includes a plurality of first electrode pads arranged in a chip circumferential section; a plurality of second electrode pads arranged inside from the plurality of first electrode pads; and an emulation circuit connected with the plurality of second electrode pads to interface with an external unit in emulation. The plurality of second electrode pads may be arranged on an area where a functional circuit is formed.

5 Claims, 7 Drawing Sheets

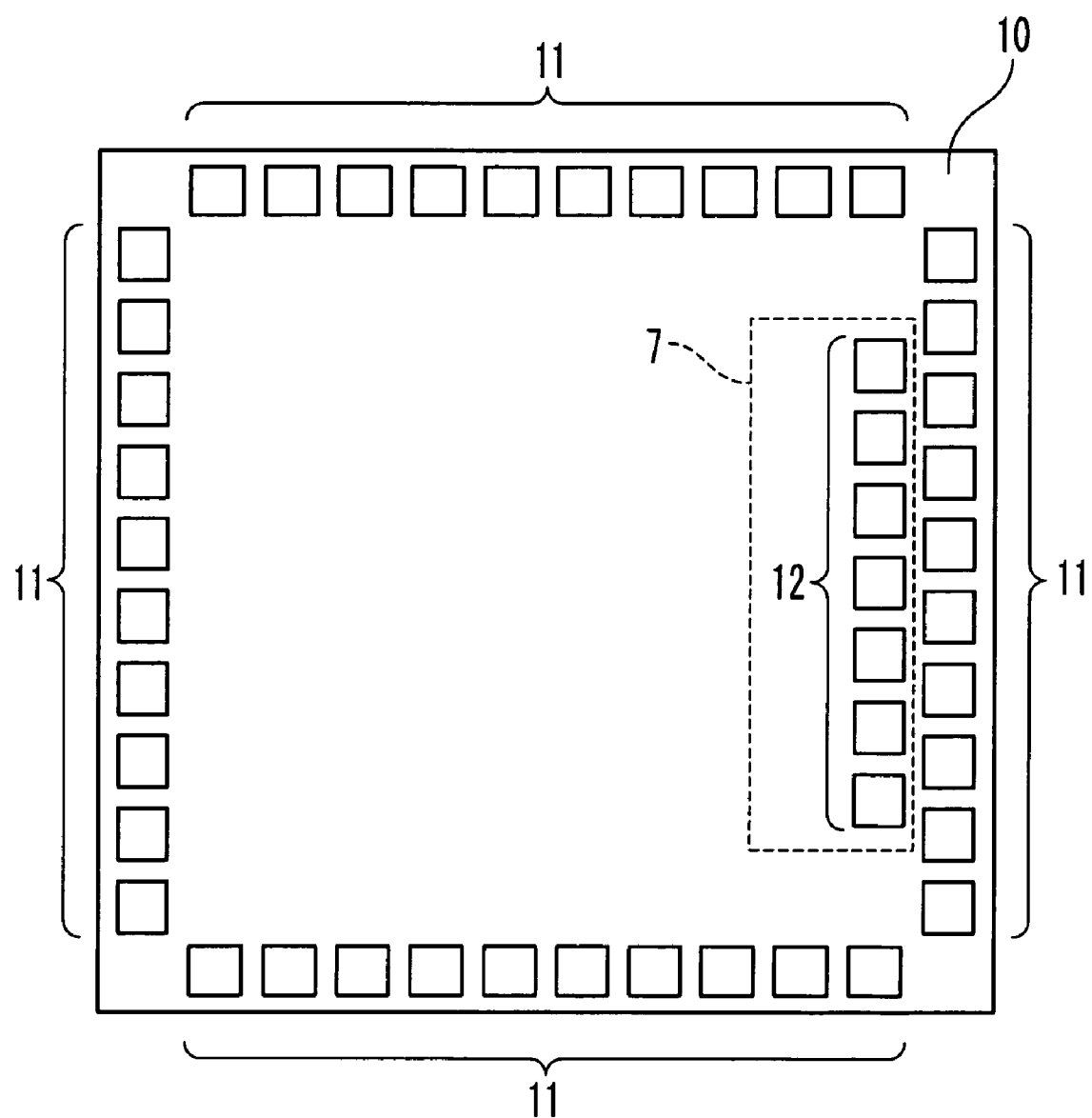

MICROCOMPUTER CHIP WITH FUNCTION CAPABLE OF SUPPORTING EMULATION

BACKGROUND OF THE INVENTION

1. Field of the Invention

The present invention generally relates to a microcomputer. More specifically, the present invention is directed to a microcomputer chip into which a function capable of supporting emulation has been assembled, a semiconductor device on which the above-explained microcomputer chip has been mounted, and an emulator for performing emulation of this microcomputer chip.

2. Description of the Related Art

In a microcomputer (to be referred to as "single chip microcomputer" hereinafter) which mounts thereon a program storing-purpose memory as a ROM, a software program to be installed in the single chip microcomputer needs to be developed. In order to develop and debug the above-described software program, an "emulator" has been conventionally used. The emulator emulates a function of the microprocessors, and provides an environment for debugging the operation of the software program and confirmations of the operation of a hardware circuit. For this purpose, the emulator is provided with a chip for emulating the function of a product, and an "evaluation chip" for controlling the chip. As the emulator, for example, "ICE (In-Circuit Emulator: registered trademark)" is known. Also, an operation for developing and debugging a software program by use of an emulator is referred to as "emulation."

When an emulator is constructed, a chip for emulating the functions of a product chip is necessary. However, it is not desired to develop this emulation chip separately from the product chip, in view of a cost-to-effect aspect. For this reason, it is proposed to incorporate the function for supporting the emulation in the product chip. In this case, since this supporting function is no longer required at a time of shipping the product chip, it is desired to suppress increase of a chip area through adding this supporting function.

As general-purpose techniques capable of suppressing the increase of the chip area, the following techniques are known.

That is, Japanese Patent Laid Open Patent Application (JP-A-Heisei 3-173433: a first conventional example) discloses a semiconductor integrated circuit device in which pads are arranged at a peripheral portion of a chip, and are electrically connected to external terminals. In this semiconductor integrated circuit device, these pads are arranged in two or more lines along the edges of this chip. Further, at least two layers are formed in a thickness direction of the chip to constitute internal wiring lines for electrically connecting the pads to an internal circuit. Also, in this conventional example, the pads other than the pads in the outermost line are used as test terminals, which are used to test LSI functions in a wafer stage. For this reason, the bonding wire is not connected to the test terminal. Only the pads in the outermost line are electrically connected to the external terminals.

Also, Japanese Laid Open Patent Application (JP-P2002-299567A: second conventional example) discloses a semiconductor device in which electrode pads are arranged and formed on a partial structural element of an integrated circuit formed on a semiconductor wafer. This structure is referred to as a "CUP (Circuit Under Pad)."

A microcomputer into which a function for supporting emulation is incorporated is packaged and then is connected to an emulator. In other words, the microcomputer contains a circuit interfacing with the emulator at least. Electrode pads used to connect this circuit with the external emulator are referred to as "emulation pads." On the other hand, electrode pads for normal use are referred to as "product pads."

In order to suppress increase of a chip area, it could be considered that that product pads are commonly used as emulation pads. The common pads are connected to switch circuits, which control the common pads to be connected to the normal circuit and the emulation circuit in response to control signals. For instance, it is assumed that a microcomputer chip has a first pad connected to the switch circuit. In this case, the first pad is connected to the emulation circuit when a software program is developed. For this reason, a function of a port connected to the first pad in the normal operation cannot be confirmed. Therefore, in order to confirm this function, another microcomputer chip having a second pad different from the first pad and connected to a switch circuit must be prepared separately from the microcomputer chip. In this way, although increase of the chip area can be avoided if the electrode pads are commonly used to the emulation pads, sorts of chips to be prepared are increased.

SUMMARY OF THE INVENTION

In an aspect of the present invention, a microcomputer chip includes a plurality of first electrode pads arranged in a chip circumferential section; a plurality of second electrode pads arranged inside from the plurality of first electrode pads; and an emulation circuit connected with the plurality of second electrode pads to interface with an external unit in emulation.

Here, the plurality of second electrode pads may be arranged on an area where a functional circuit is formed.

The plurality of second electrode pads may be arranged along a part of the plurality of first electrode pads. In this case, the plurality of second electrode pads may be arranged according to one of sides of the microcomputer chip. Otherwise, the plurality of first electrode pads and the plurality of second electrode pads may be arranged in a zigzag manner.

In another aspect of the present invention, a microcomputer chip includes a plurality of first electrode pads arranged in a chip circumferential section; and a plurality of second electrode pads to which wire bonding is carried out for emulation.

Here, the plurality of second electrode pads may be arranged on an area where a functional circuit is formed.

Also, the plurality of second electrode pads may be arranged along a part of the plurality of first electrode pads. In this case, the plurality of second electrode pads may be arranged according to one of sides of the microcomputer chip. Otherwise, the plurality of first electrode pads and the plurality of second electrode pads may be arranged in a zigzag manner.

In another aspect of the present invention, a microcomputer device includes a memory in which a software program is stored; a peripheral circuit; an input/output circuit; a CPU configured to execute the software program to control the peripheral circuit and the input/output circuit; a plurality of first electrode pads arranged in a chip circumferential section and connected with the input/output circuit; a plurality of second electrode pads arranged inside from the plurality of first electrode pads; and an emulation circuit connected with the plurality of second electrode pads.

Here, the plurality of second electrode pads may be wire-bonded to an external unit for emulation.

In another aspect of the present invention, an emulator system includes a microcomputer device; and a control device connected with the microcomputer device. The microcomputer device includes a memory to store a software program; a peripheral circuit; an input/output circuit; a CPU configured to execute the software program to control the peripheral circuit and the input/output circuit; a plurality of first electrode pads arranged in a chip circumferential section and connected with the input/output circuit; a plurality of second electrode pads arranged inside from the plurality of first electrode pads; and an emulation circuit connected with the plurality of second electrode pads. The control device is connected with the microcomputer device through the plurality of second electrode pads and controls the peripheral circuit through the emulation circuit and the plurality of second electrode pads in emulation.

In another aspect of the present invention, a method of developing a microcomputer, may be achieved by (a) providing a microcomputer chip for emulation which may include: a plurality of first electrode pads arranged in a chip circumferential section, a plurality of second electrode pads arranged inside from the plurality of first electrode pads, and an emulation circuit connected with the plurality of second electrode pads to interface with an external unit; by (b) producing a development-purpose package by wire-bonding the plurality of first electrode pads and the plurality of second electrode pads with the external unit; by (c) developing a software program to be loaded into a microcomputer through emulation using the development-purpose package; by (d) writing the developed software program in a memory area in a microcomputer chip for a product, the microcomputer chip for the product having a same configuration as that of the microcomputer chip for the emulation; and by (e) carrying out wire-bonding to the plurality of first electrode pads without carrying out wire-bonding the plurality of second electrode pads to produce a product-purpose microcomputer chip.

BRIEF DESCRIPTION OF THE DRAWINGS

FIG. 7 is another plan view showing the microcomputer chip according to the second embodiment of the present invention.

DESCRIPTION OF THE PREFERRED EMBODIMENTS

Hereinafter, a semiconductor device incorporating a microcomputer of the present invention will be described with reference to the attached drawings.

Figure 1:
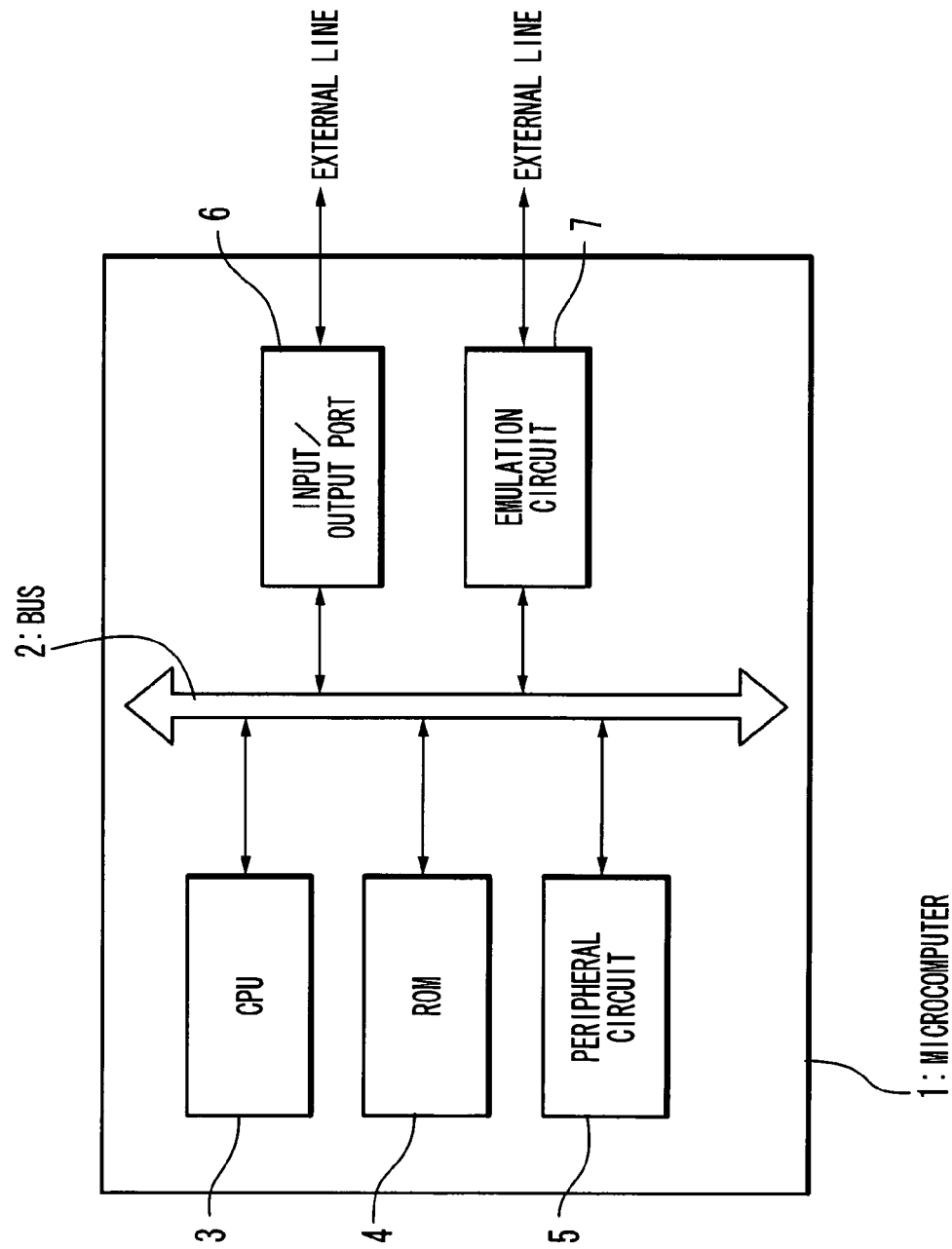
FIG. 1 is a block diagram schematically showing a configuration of a microcomputer according to the present invention.

FIG. 1 is a block diagram showing a configuration of a microcomputer 1 according to the present invention. This microcomputer 1 is provided with a CPU (Central Processing Unit) 3, a ROM (Read-Only Memory) 4, a peripheral circuit 5, an input/output circuit 6, and an emulation circuit 7, which are all connected to a bus 2. The input/output circuit 6 operates as interface ports with an external unit. A software program for a function of this microcomputer 1 is stored in the ROM 4. When the microcomputer 1 is used for the product, the CPU 3 reads out the software program stored in the ROM 4, and then executes the program. Thus, the function can be realized by the CPU 3.

When the microcomputer 1 is developed, development of a software program to be stored in this ROM 4 is carried out. In order to develop this software program, an "emulator" is used to provide an environment for a debugging operation of the software program and operation confirmation of a hardware circuit. When the emulation is carried out, the emulator is connected to the emulation circuit 7 of the microcomputer 1. In other words, the emulation circuit 7 contains an I/O buffer at least, and provides a function of interfacing with an external unit (not shown) on the emulation. Instead of the CPU 3 and the ROM 4, instructions are issued via the emulation circuit 7 to the peripheral circuit 5, and statuses of the peripheral circuit 5 are monitored through this emulation circuit 7. Thus, the debugging operation of the software program and the operation of the hardware circuit are confirmed.

In this way, the function of supporting the emulation is incorporated in the microcomputer 1 according to the present invention. As a consequence, this microcomputer 1 may not only be shipped as the product, but also may be used in emulation. An emulation environment may be built up by the microcomputer 1 according to the present invention and the emulator.

First Embodiment

Figure 2:
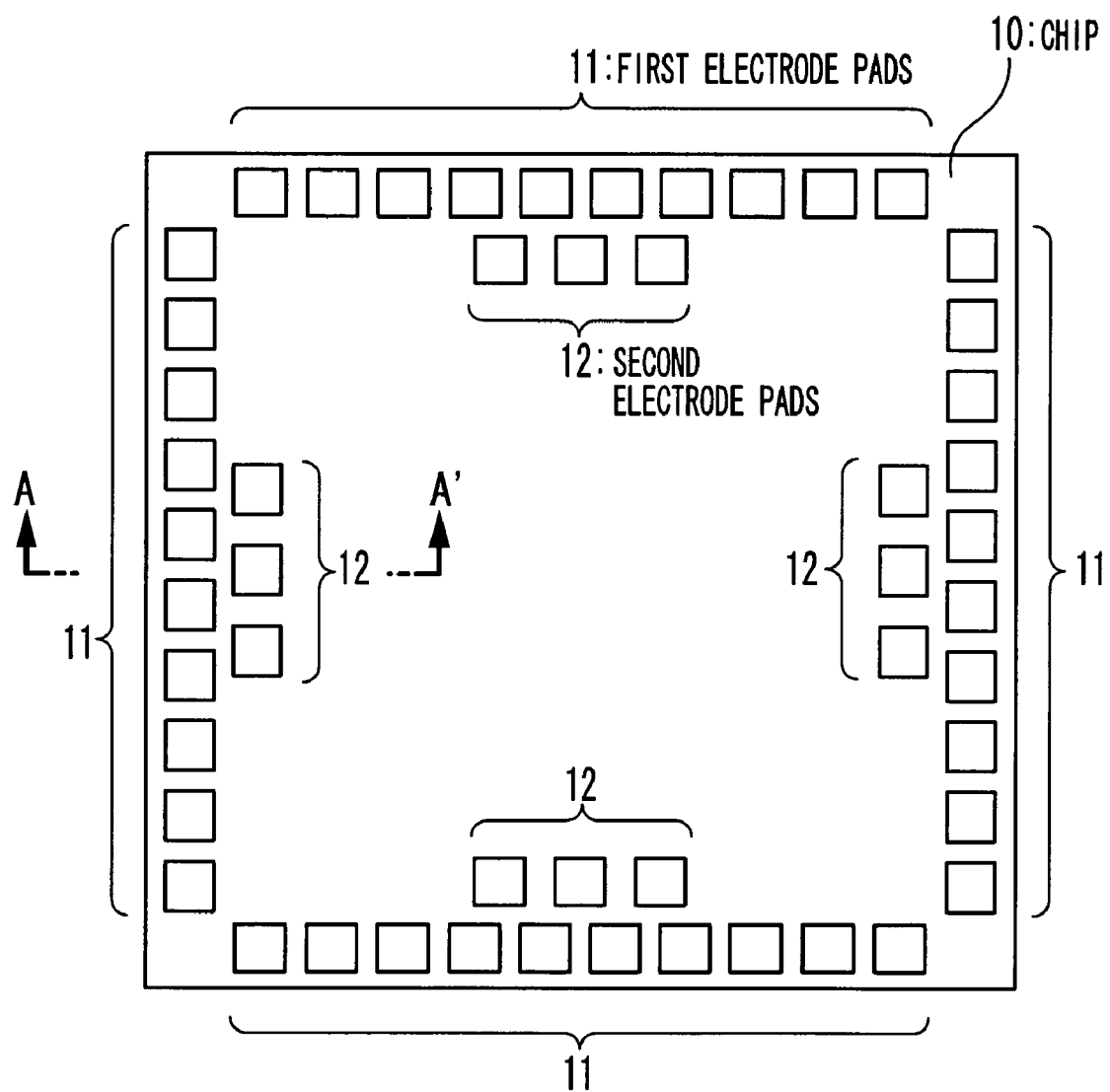
FIG. 2 is a plan view showing the microcomputer chip according to a first embodiment of the present invention.

FIG. 2 is a plan view showing a microcomputer chip 10 according to the first embodiment of the present invention. This microcomputer chip 10 is provided with a plurality of first electrode pads 11, and a plurality of second electrode pads 12.

The plurality of first electrode pads 11 are connected to input/output ports of the input/output circuit 6 and are used as input/output pads of data signals for the emulation as well as the input/output pads for the normal use. As shown in FIG. 2, the plurality of first electrodes 11 are arranged in a single line along four edges of the microcomputer chip 10. In other words, thee plurality of first electrode pads 11 are arranged in the single line in a circumferential portion of the microcomputer chip 10. The plurality of first electrode pads 11 are wire-bonded to leads (not shown) provided outside the microcomputer chip 10 and connected to an external unit. In view of a bonding process, it is preferable that the plurality of first electrode pads 11 are arranged in the chip circumferential portion in a same interval. As a total number of these first electrode pads 11 is 64, for example (some of the first electrodes are omitted in FIG. 2).

The plurality of second electrode pads 12 are connected to the emulation circuit 7 and are exclusively used as emulation pads for the emulation. The plurality of second electrode pads 12 are wire-bonded with external wiring lines (not shown) only for the emulation, through which an external controller is connected. As shown in FIG. 2, the plurality of second electrode pads 12 are arranged partially on the inner side from the plurality of first electrode pads 11. Thus, it is possible to avoid that the second electrodes 12 hinder the bonding process of the first electrodes 11. A total number of the second electrode pads 12 may be a minimum and necessary number. For instance, the total number is in a range of 10 to 20. As shown in FIG. 2, the plurality of second electrode pads 12 are arranged in some groups along a portion of the plurality of first electrode pads 11.

As described above, according to the microcomputer chip 10 of the first embodiment of the present invention, the second electrodes 12 which are dedicated to the emulation are provided. Since the product pads (namely, first electrode pads 11) need not be used as the emulation pads, two or more sorts of chips are no longer prepared when a microcomputer is developed. In other words, according to this microcomputer chip 10, the developing cost thereof can be reduced while eliminating the useless microcomputer chip. Also, since the product pads need not be used as the emulation pads, it is possible to avoid the performance of the microcomputer 1 is lowered.

Furthermore, in accordance with the microcomputer chip 10 of the first embodiment of the present invention, the second electrode pads 12 which are exclusively used for the emulation are arranged inside the first electrode pads 11. The second electrode pads 12 are not additionally provided on the line along which the first electrode pads 11 are arranged, so that increase of the area for this microcomputer chip 10 can be suppressed. Also, an arrangement of the plurality of second electrode pads 12 never gives an adverse influence to the arrangement of the plurality of first electrode pads 11. As a consequence, when a product is manufactured, the plurality of second electrode pads 12 never hinder wiring of the plurality of first electrode pads 11. Since the microcomputer chip 10 according to the first embodiment of the present invention may be used as a product, the structure is suitable.

Alternatively, as shown in FIG. 2, both of the first electrode pads 11 and the second electrode pads 12 may be arranged in a zigzag shape. That is to say, each of the plurality of second electrode pads 12 may be arranged between adjacent two of the first electrode pads 11. As a consequence, the internal wiring lines which are connected to both of the first electrode pads 11 and the second electrode pads 12 can be arranged in a higher efficiency within the microcomputer chip 10. Accordingly, the entire area of this microcomputer chip 10 can be reduced.

Figure 3:
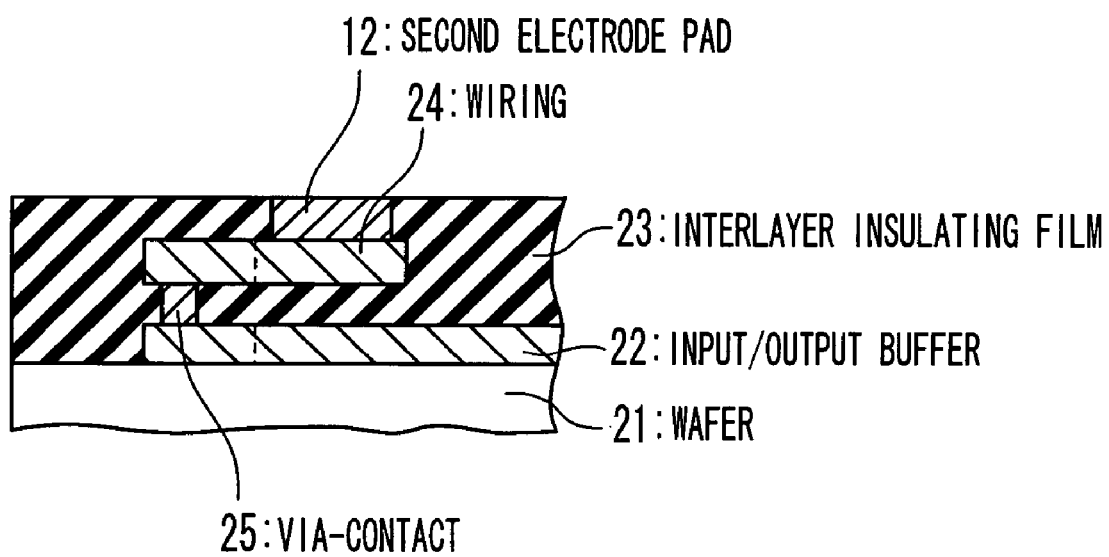
FIG. 3 is a cross sectional view showing a structure of the microcomputer chip taken along a line A-A' shown in FIG. 2.

FIG. 3 is a cross sectional view showing the structure of the microcomputer chip 10, taken along a line A-A' shown in FIG. 2. As shown in FIG. 3, for instance, an input/output buffer 22 is formed on a wafer 21 of this microcomputer chip 10. A predetermined wiring line 24 is formed via an interlayer insulating film 23 on the input/output buffer 22. A second electrode pad 12 and the input/output buffer 22 are electrically connected to each other via the wiring line 24 and a via-contact 25.

In this structure, the plurality of second electrode pads 12 are arranged above a region where a function circuit has been formed. For instance, as shown in FIG. 3, the second electrode pads 12 are formed above the input/output buffer 22. In other words, this microcomputer chip 10 has a CUP (Circuit Under Pad) structure. As a result, the chip area of the microcomputer chip 10 may be furthermore reduced. It should be understood that similar to the second electrode pads 12, the first electrode pads 11 may be formed on the integrated circuit region. In this case, the area of the microcomputer 10 may be further reduced.

Figure 4:
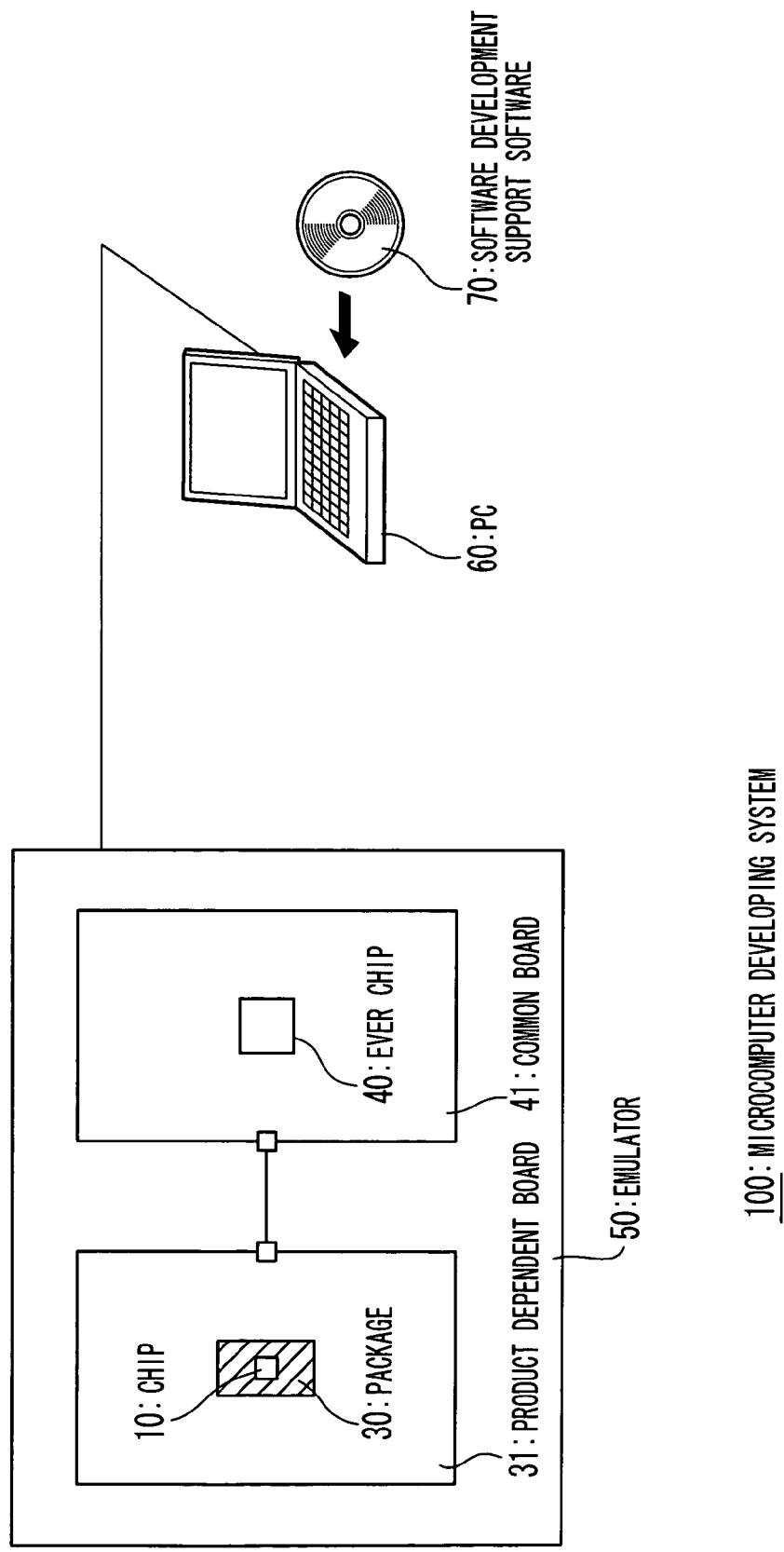
FIG. 4 is a conceptional diagram showing a configuration of a microcomputer developing system according to the first embodiment of the present invention.

FIG. 4 is a conceptional diagram showing the configuration of a microcomputer developing system 100 according to the first embodiment of the present invention. The microcomputer developing system 100 contains an emulator 50 and a terminal unit (PC: personal computer) 60. The emulator 50 provides an environment that a debugging operation of a software program is carried out and an operation of a hardware circuit is confirmed. More specifically, the emulator 50 is provided with a "product board" 31, a "common board" 41, and the like. The "product board" 31 is used to mount thereon the microcomputer chip 10 which is developed. The "common board" 41 is used to mount thereon an evaluation chip 40 which provides common functions (replacement of CPU/ROM, status monitor etc.) which are required in emulation. Since the product board 31 and the common board 41 are used, an emulation environment may be constructed. It should also be understood that the product board 31 may be replaced by another product board (not shown). Also, a user system (not shown) is connected through a cable to the product board 31.

The terminal unit 60 is connectable with the emulator 50, and provides a user interface. Into this terminal unit 60, development supporting software 70 for a software program to be distributed is installed. A user executes the development supporting software 70, and can issue various sorts of instructions to the emulator 50, while the user refers to information displayed on a display unit of the terminal unit 60. The emulator 50 executes emulation in response to the instruction issued from the user.

When software program is developed, the plurality of first electrode pads 11 and the plurality of second electrode pads 12 of the microcomputer chip 10 according to the first embodiment of the present invention are bonded with leads (namely, external wiring lines). Thereafter, the electrode pads 11 and 12 are processed via a resin sealing step, so that a package 30 is obtained. As the package 30 obtained at this time, a BGA (Ball Grid Array) is exemplified. Since a freedom degree of a substrate which mounts thereon the chip 10 is relatively high, this BGA package can be readily bonded with both of the first electrode pads 11 and the second electrode pads 12. The package 30 which has been formed in the above-described manner is mounted on the above-described product board 31.

The plurality of second electrode pads 12 of the microcomputer chip 10 contained in the package 30 are connected to the evaluation chip (control device) 40 mounted on the common board 41. In other words, the emulation circuit 7 of the microcomputer chip 10 which is to be developed is connected via predetermined wiring lines to the evaluation chip 40. The evaluation chip 40 outputs various sorts of instructions in response to a command issued from the user. The outputted instructions are directly supplied via the plurality of second electrode pads 12 and the emulation circuit 7 to the peripheral circuit 5. In this case, a total number of the plurality of second electrode pads 12 is equal to, for example, 10. The instructions outputted from the evaluation chip 40 are supplied in a parallel. In this way, the evaluation chip 40 controls the emulation. The user can develop the software program in a high efficiency by using this emulator 50.

After the software program is developed, a package functioning as a product is manufactured. As this product, the same microcomputer chip 10 is used. However, when the product is manufactured, only the plurality of first electrode pads 11 are wire-bonded with the leads (external wiring lines). Thereafter, the first electrode pads 11 are processed via a resin sealing step, so that a package used for the product is manufactured. As this package obtained at this time, a QFP (Quad Flat Package) is exemplified. As described above, although the microcomputer chip 10 used when the software program is developed and the microcomputer chip 10 when the product is manufactured have a same circuit configuration and circuit pattern, the resulting packages may be different from each other.

Figure 5:
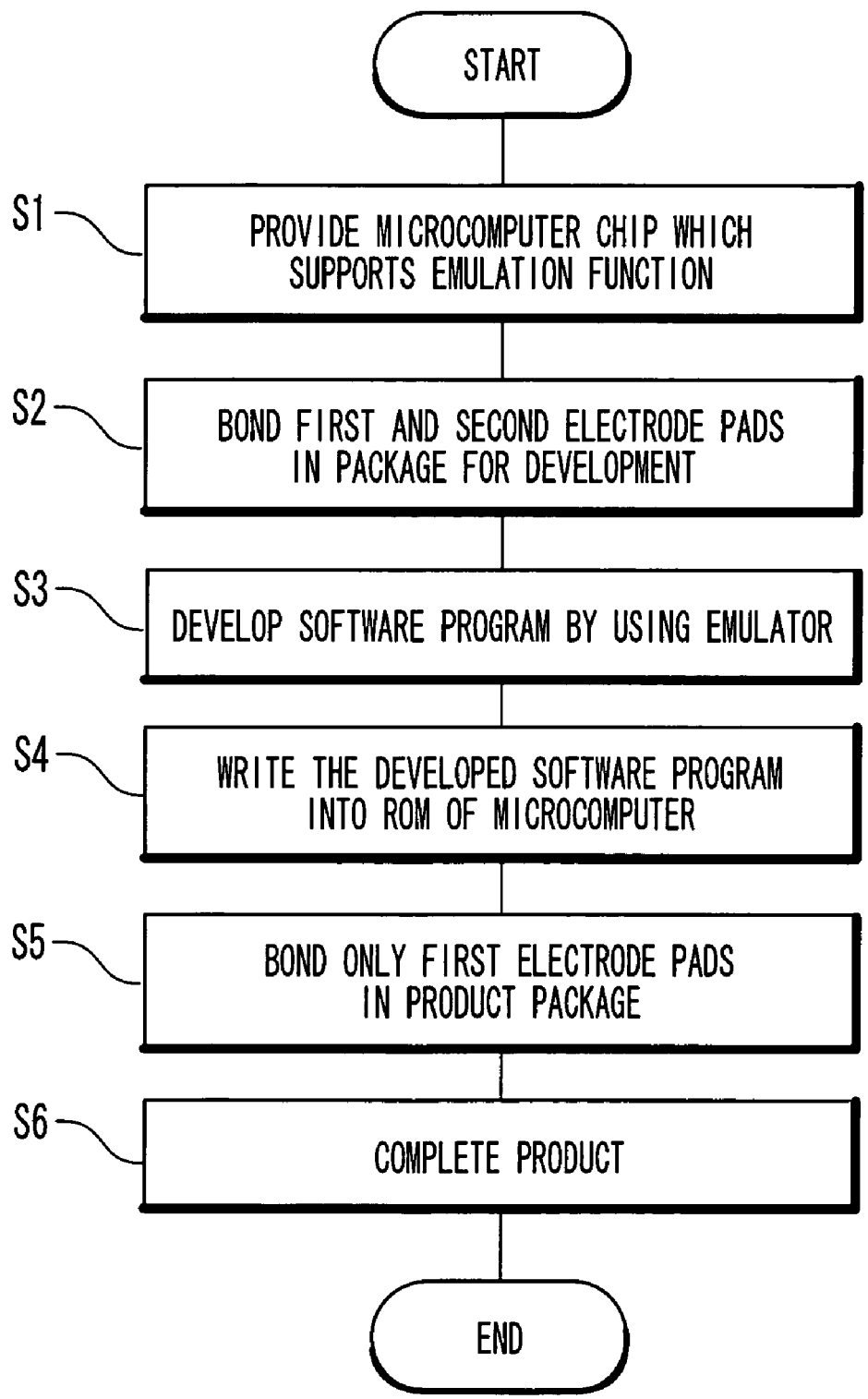
FIG. 5 is a flow chart showing a microcomputer developing method according to the first embodiment of the present invention.

FIG. 5 is a flow chart showing a developing method of a microcomputer according to the first embodiment of the present invention. In this flow chart, in a first step S1, the microcomputer chip 10 shown in FIG. 2 is provided. Next, a developing operation of a software program to be stored in the ROM 4 is carried out. For this purpose, a package for a development purpose, for example, a BGA type package is used. In this step S2, both of the first electrode pads 11 and the second electrode pads 12 are bonded with the external wiring lines. Next, while this developing-purpose package 30 (namely, BGA type package) and the microcomputer developing system 100 shown in FIG. 4 are utilized, emulation is carried out. Thus, the software program may be developed in a step S3.

Subsequently, a product is manufactured. More specifically, the microcomputer chip 10 having the same circuit configuration is provided, and the software program which has been developed in the previous step is written into a storage region of the ROM 4 in a step S4. Next, a package for a product is formed. For instance, a QFP type package is used. Also, in this case, only the first electrode pads 11 are wire-bonded to the external wiring lines in a step S5. As a result, the product may be accomplished in the above-explained manner (step S6).

Second Embodiments

In FIG. 2, the plurality of second electrode pads 12 are arranged along the four sides of the microcomputer chip 10. However, the present invention is not limited only to this arrangement of the plurality of second electrode pads 12.

Figure 6:
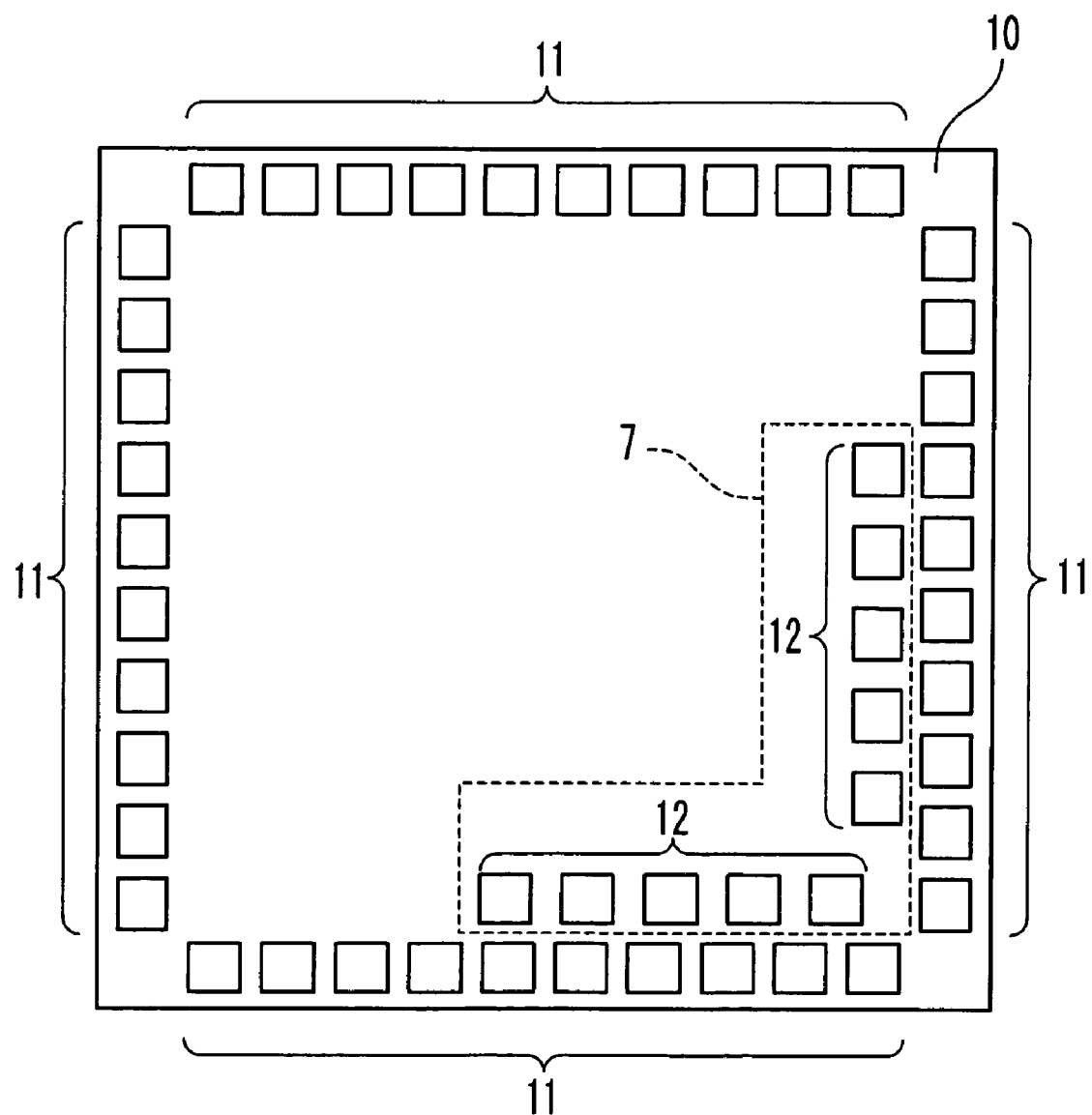
FIG. 6 is a plan view showing the microcomputer chip according to a second embodiment of the present invention.

FIG. 6 is a plan view showing one example of the microcomputer chip 10 according to the second embodiment of the present invention. Similar to the first embodiment, the plurality of second electrode pads 12 are arranged inside the plurality of first electrode pads 11. In this second embodiment, the plurality of second electrode pads 12 are not distributed, but are arranged at a predetermined region in a concentration manner. As a consequence, structural elements of the emulation circuit 7, which are connected to the plurality of second electrode pads 12 may be easily concentrated to one place. Thus, it is possible to avoid that the emulation circuit 7 which is used only when emulation is carried out reduces the chip area of a main circuit. As a result, increasing of an area of this microcomputer chip 10 may be suppressed.

FIG. 7 is a plan view showing another example of the microcomputer chip 10 according to the second embodiment of the present invention. Similar to the first embodiment, a plurality of second electrode pads 12 are arranged inside the plurality of first electrode pads 11. Also, similar to the case shown in FIG. 6, the plurality of second electrode pads 12 are arranged at a predetermined area in a concentration manner. Furthermore, in this example, the plurality of second electrode pads 12 are arranged in one direction along one side of the microcomputer chip 10. Effects achieved by the above-described example are given as follows:

That is, as described above, when the emulation-purpose package 30 is manufactured, both of the first electrode pads 11 and the second electrode pads 12 are wire-bonded to the leads. As a consequence, in case of wire bonding, wires which are bonded to the first electrode pads 11 are easily contacted to wires which are bonded to the second electrode pads 12. More specifically, when a resin sealing step is executed, the bonding wires are flextured by the resin to be injected, so that the flextured bonding wires may be readily contacted to the adjoining bonding wire. In accordance with this example, the plurality of second electrode pads 12 are arranged along one direction. As a result, if the injection direction of the resin is adjusted, the bonding wires are not featured. Thus, the contact of the bonding wires can be prevented and generation of shirt-circuit can be prevented.

It should also be noted that both of the first electrode pads 11 and the second electrode pads 12 may be preferably arranged in the zigzag form also in this second embodiment. Further, it is preferable that the microcomputer chip 10 owns the CUP structure shown in FIG. 3. As a result, increasing of the area of this microcomputer chip 10 can be suppressed.

As previously described, in accordance with the present invention, the developing cost for the microcomputer can be reduced. Also, it is possible to avoid that the performance of the microcomputer is lowered. Furthermore, increasing of the chip area can be suppressed.

In accordance with the microcomputer chip, the semiconductor device, and the emulator of the present invention, total cost required for developing a microcomputer can be reduced. Also, in accordance with the microcomputer chip and the semiconductor device of the present invention, it is possible to avoid that the performance of the microcomputer is lowered. Also, in accordance with the microcomputer chip and the semiconductor device of the present invention, increasing of the area of the microcomputer chip can be suppressed. Further, in accordance with the microcomputer chip and the semiconductor device of the present invention, it is possible to avoid that bonding wires are made contact to each other.

What is claimed is:

1. A microcomputer chip comprising:
   a plurality of first electrode pads arranged in a chip circumferential section;
   a plurality of second electrode pads arranged inside from said plurality of first electrode pads; and
   an emulation circuit connected with said plurality of second electrode pads to interface with an external unit in emulation.

2. The microcomputer chip according to claim 1, wherein said plurality of second electrode pads are arranged on an area where a functional circuit is formed.

3. The microcomputer chip according to claim 1, wherein said plurality of second electrode pads are arranged along a part of said plurality of first electrode pads.

4. The microcomputer chip according to claim 3, wherein said plurality of second electrode pads are arranged according to one of sides of said microcomputer chip.

5. The microcomputer chip according to claim 3, wherein said plurality of first electrode pads and said plurality of second electrode pads are arranged in a zigzag manner.

* * * * *